United States Patent [19]

Tinet

[11] Patent Number: 5,126,989

[45] Date of Patent: * Jun. 30, 1992

[54] ARRANGEMENT FOR READING AN OPTICALLY READABLE LIGHT REFLECTIVE CARRIER

[75] Inventor: Claude Tinet, Paris, France

[73] Assignee: Thomson-CSF, Paris, France

[*] Notice: The portion of the term of this patent subsequent to Aug. 8, 2006 has been disclaimed.

[21] Appl. No.: 544,904

[22] Filed: Jun. 28, 1990

Related U.S. Application Data

[60] Continuation of Ser. No. 350,773, May 12, 1989, Pat. No. 5,016,235, which is a continuation of Ser. No. 213,097, Jun. 29, 1988, Pat. No. 4,856,108, which is a division of Ser. No. 96,317, Sep. 9, 1987, Pat. No. 4,868,808, which is a continuation of Ser. No. 925,491, Oct. 29, 1986, abandoned, which is a continuation of Ser. No. 667,100, Nov. 1, 1984, abandoned, which is a division of Ser. No. 545,110, Oct. 25, 1983, Pat. No. 4,491,940, which is a continuation of Ser. No. 108,499, Dec. 31, 1979, abandoned, which is a continuation of Ser. No. 793,270, May 3, 1977, abandoned, which is a continuation of Ser. No. 390,715, Aug. 23, 1973, abandoned.

[30] Foreign Application Priority Data

Aug. 25, 1972 [FR] France ............... 72 30346

[51] Int. Cl.$^5$ ............................................. G11B 7/09
[52] U.S. Cl. ........................... 369/44.260; 369/109; 369/111; 369/275.4; 358/342
[58] Field of Search ............. 369/43, 44.11, 44.41, 369/109–111, 275.4, 276, 44.26; 358/342; 365/120, 124; 250/201.1, 202, 570

[56] References Cited

U.S. PATENT DOCUMENTS

| | | | |
|---|---|---|---|
| 3,198,880 | 8/1965 | Toulon | 358/342 X |
| 3,228,015 | 1/1966 | Miyata | 360/114 |
| 3,287,563 | 11/1966 | Clunis | 365/126 X |
| 3,530,258 | 9/1970 | Gregg et al. | 369/46 |
| 3,534,166 | 10/1970 | Korpel | 369/108 X |
| 3,654,401 | 4/1972 | Dickopp et al. | 369/111 X |
| 3,687,664 | 8/1972 | Broadbent | 156/643 X |
| 3,688,025 | 8/1972 | Whittemore, Jr. | |
| 3,689,692 | 9/1972 | Shung-Senih | |
| 3,715,524 | 2/1973 | Adler | 358/342 X |
| 3,798,388 | 3/1974 | Dickopp | 369/275 X |
| 3,829,622 | 8/1974 | Elliot | |
| 3,833,769 | 9/1974 | Compaan et al. | 369/46 X |
| 3,838,401 | 9/1974 | Graf et al. | 369/275 X |
| 3,855,426 | 12/1974 | Bouwhuis | 369/45 X |
| 3,956,582 | 5/1976 | Bouwhuis | |
| 3,999,009 | 12/1976 | Bouwhuis | 369/275 X |
| 4,041,530 | 8/1977 | Kramer et al. | 369/111 X |
| 4,491,940 | 1/1985 | Tinet | 369/275 X |
| 4,856,108 | 8/1989 | Tinet | 369/46 |

OTHER PUBLICATIONS

Crovatto, "Sensing Holes and Marks", Apr. 1971, IBM Technical Disclosure, vol. 13, No. 11.
Tolansky, "Revolution in Optics", 1968.
Electronics Review, "Philips TV Disk, Read by Light Beam, Could Shape Market", Sep. 1972.
Hrbek, G. W., "An Experimental Optical Videodisk Playback System", Journal of the SMPTE, vol. 83, Jul. 1984, pp. 580–582.

*Primary Examiner*—Roy N. Envall, Jr.
*Assistant Examiner*—W. R. Young
*Attorney, Agent, or Firm*—Oblon, Spivak, McClelland, Maier & Neustadt

[57] ABSTRACT

The present invention concerns an arrangement for reading an optically readable light reflective carrier on which data is stored in the form of diffractive elements which are deviations from a reference surface. The data elements each have a plurality of adjacent tracks located on the carrier with data elements being positioned on adjacent tracks. The system utilizes an illumination means for projecting a concentrated light spot onto the carrier in order to obtain diffraction of light along the entire length of each of the data elements with an optical arrangement collecting light reflected from a carrier in such a way that the light energy which is received when a projected light spot impinges on the reference surface is greater than the light energy received when the projected light spot impinges on a data element.

7 Claims, 4 Drawing Sheets

ARRANGEMENT FOR READING AN OPTICALLY READABLE LIGHT REFLECTIVE CARRIER

This application is a continuation of application Ser. No. 07/350,773, filed on May 12, 1989, now U.S. Pat. No. 5,016,235, which is a continuation of application Ser. No. 07/213,097 filed on Jun. 29, 1988, now U.S. Pat. No. 4,856,108, which is a division of application Ser. No. 07/096,317 filed on Sep. 9, 1987, now U.S. Pat. No. 4,868,808, which is a continuation of application Ser. No. 06/925,491, filed on Oct. 29, 1986, now abandoned, which is a continuation of application Ser. No. 06/667,100, filed on Nov. 1, 1984, now abandoned, which is a division of application Ser. No. 06/545,110, filed on Oct. 25, 1983, now U.S. Pat. No. 4,491,940, which is a continuation of application Ser. No. 06/108,499, filed on Dec. 31, 1979, now abandoned, which is a continuation of application Ser. No. 05/793,270, filed on May 3, 1977, now abandoned, which is a continuation of application Ser. No. 05/390,715, filed on Aug. 23, 1973, now abandoned.

BACKGROUND OF THE INVENTION

1. Field of the Invention

The present invention relates to a system for reproducing from a record data-carrying signals stored upon a substrate the surface of which, along a rectilinear or curvelinear track, exhibits irregularities in the form of depressions or projections, which correspond with the time variation in the signals carrying said data. This time variation is optically detected during the scanning of the track, by the effect exercised by these surface irregularities upon the optical diffraction of a concentrated read-out beam which converges onto the engraved surface of the record.

The invention likewise relates to a record or data-carrier appropriate to said method of recording by virtue of depressions or projections, and to a reproducing device which makes it possible to effect optical read-out of the signals stored in relief form at the surface of said carrier.

2. Discussion of the Background

In the known methods of reproducing signals which are stored in the form of superficial deformations of the surface of a record, for read-out purposes, use is made of a stylus which displaces in a groove imparting to the stylus lateral or depth displacements. The movements imparted by the modulation in the groove or track, to the tip of the stylus, are communicated to an electromechanical transducer which supplies a voltage proportional to the instantaneous velocity or amplitude of the tip of the read-out stylus. These methods have numerous drawbacks, the major of which are the wear in the stylus, in the carrier or substrate, the play back distortion and the difficulty of making the stylus assembly of the transducer follow the high frequency components which succeed one another at very close intervals.

Also known are methods of optically reading out a carrier carrying a photographically recorded track and exhibiting variations in optical density or in width, corresponding to the time variation of a signal. A difficulty with these systems, resides in the fact that the copies of the carrier are obtained by photochemical methods, more expensive than the die-stamping methods employed with ordinary sound record discs. Another difficulty of these optical methods which are based upon the projection of enlarged images, resides in the small depth of field of the objective lenses used to form the enlarged image of the track, and in the limitation imposed upon the resolving power, due to the phenomenon of diffraction. In order to overcome these difficulties, it has been proposed a method of holographic recording by which the carrier may be copied by a stamping operation, but this technique involves the use of relatively powerful coherent light sources since the diffraction efficiency of the recorded holograms is relatively poor. Hitherto, the major difficulty with systems for mechanically or optically scanning the carriers on which the signal is recorded, has consisted in maintaining a proportional relationship between the amplitude of the deformation recorded on the track, and the electrical signal furnished by the read-out equipment. This amplitude proportionality can be roughly satisfied if the stored signals are pulse time modulated waveforms taking the form of successive square wave envelopes containing transitions between two levels. The precise location of such transistions in time, serves to faithfully translate the information. This is particularly the case in telecommunications systems utilising frequency or phase modulation. There is nothing to prevent this principle from being applied to the field of optical recording with a view to simplifying the process of scanning and reading out a record wherein, the embossed pattern engraved corresponds to a purely time variation on the part of an alternating data-carrying signal.

SUMMARY OF THE INVENTION

The present invention relates to a material data-carrier or record designed to be read out optically by transmission or by reflection, at least one of the engraved faces of which comprises, arranged in accordance with at least one recorded track, a series of irregularities in the form of depressions or projections, corresponding to the time variation of an alternating signal; one level of said alternating signal is translated by a portion of said track not containing an irregularity, another level of said alternating signal is translated by a portion of said track which does contain an irregularity, the width of which, measured perpendicularly to the track axis, does not exceed two microns and the length of which, along said track, is equal to or greater than said width. Microscopic examination of the surface of the record, would exhibit the presence of a chain of diffractive elements of more or less elongated form and, in accordance with an essential feature of the invention, it is purely by virtue of their diffractive power, that the depressions or projections at the surface of the carrier, serve to reconstitute the recorded alternating signal. Their shape is in no way critical and they can be readily obtained for example by chemically etching a smooth plate through a suitably exposed photosensitive resin mask. The optical accuracy and fidelity of the transcription of the signal, depend upon the location, upon the track, of the diffractive elements which constitute it, and not upon particularly careful cutting of its surface or upon the change in its optical properties, in the way which is the case in the known systems. The small transverse dimensions of the track, due to the systematic exploitation of the phenomenon of diffraction, mean that an extremely high datastorage capacity is achieved. If the record takes the form of a disc and if the track is of spiral shape, then the neighbouring turns of the spiral can be located very close together indeed; the result is that, in accordance with another feature of the invention, read-out is performed using a concentrated light spot having a diameter comparable with the width of the track; the centering of this light spot to within a fraction of a micron, is achieved by positional control of the light source illuminating the track, during the read-out phase.

The invention likewise relates to an optical read out device for reproducing the engraved record comprising, illuminating means the wavelength of which is of the same order of magnitude as the width of the track; these means, at the surface of the carrier, form a light spot of diameter substantially equal to the track width; the centering of this spot is ensured, as required, by the use of positional control under the command of two photodetectors picking up the light diffracted by the track.

In accordance with the present invention there is provided a system for reproducing from a recorded track having an axis, a pulse time modulated waveform, said system comprising: a record having at least one engraved face carrying an embossed print of said recorded track, and associated with said record a reproducing device arranged for optically reading out said embossed print; said embossed print being constituted by a succession of diffractive elements distributed along said axis in accordance with the sequence of pulses of said waveform; the width of said embossed print being substantially constant along said axis, and the non-uniform length and spacing of said diffractive elements being at least equal to said width; said reproducing device including illumination means for projecting a concentrated spot of radiant energy onto said embossed print, photo-electric detection means arranged for selectively collecting the diffracted radiant energy emerging from the portion of said embossed print illuminated by said concentrated spot, and moving means arranged for following with said concentrated spot, the path of said embossed print.

BRIEF DESCRIPTION OF THE DRAWINGS

For a better understanding of the present invention, and to show how the same may be carried into effect, reference will be made to the ensuing description and the attached figures, among which.

DETAILED DESCRIPTION OF THE PREFERRED EMBODIMENTS

Figure 1:
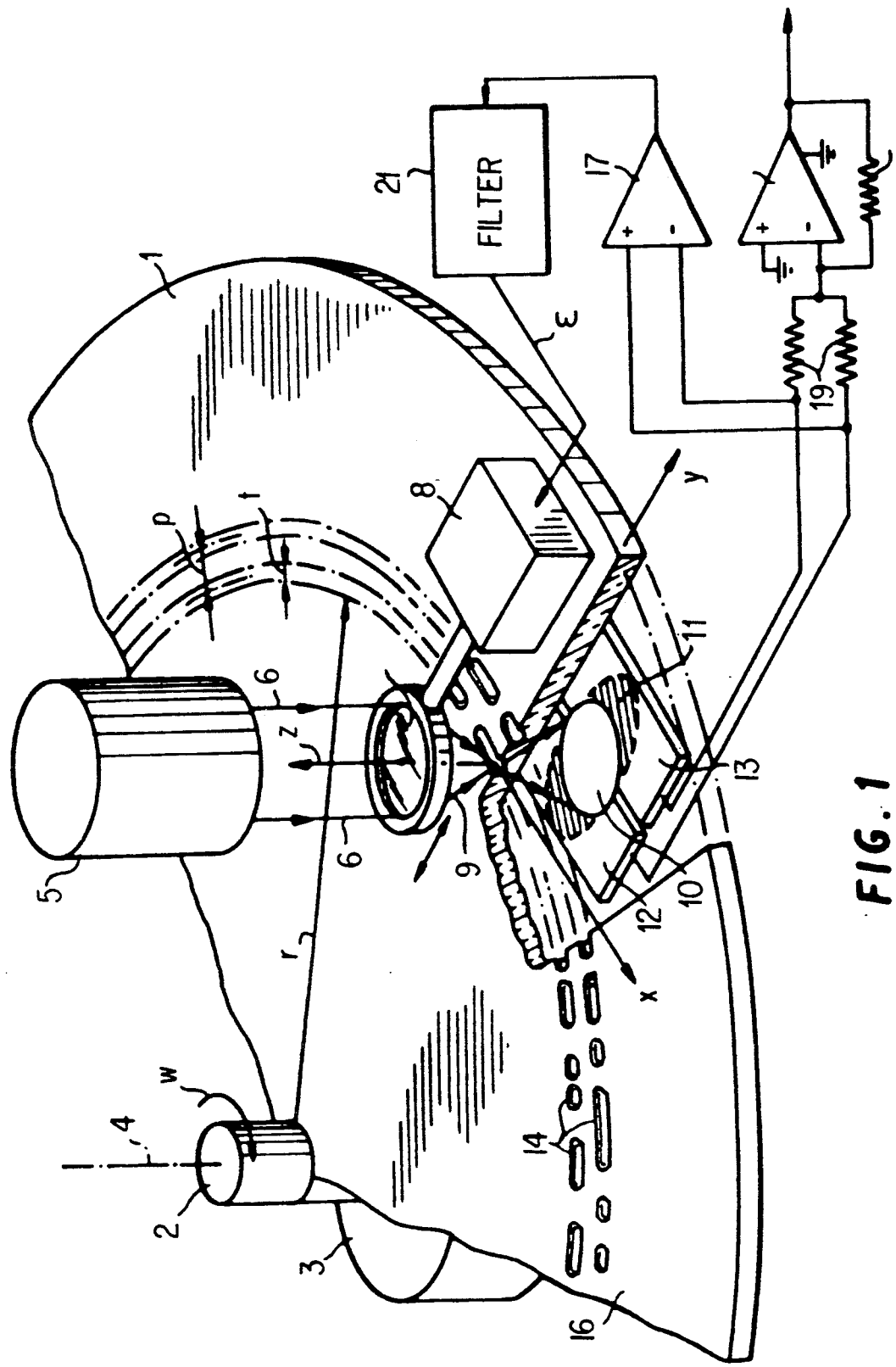
FIG. 1 is an isometric view illustrating the record in accordance with the invention, and its optical read-out device.

FIG. 1 illustrates a record 1 in the form of a circular disc which can rotate in its own plane, at an axis 4, thanks to the provision of a drive pin 2 mechanically connected to a motor 3. The bottom face of the disc 1, parallel to the plane x o y, is assumed to be smooth, and the top face 16, parallel to the latter is also smooth but contains a succession of diffractive elements 14 in the form of depressions or projections, arranged in the form of the turns 15 of a spiral track. Each of the elements 14 has a contour, in the plane of the face 16, of more or less elongated shape, the width 1 of which is substantially constant and does not exceed two microns. The element 14 can take the form of a shallow trough hollowed out of the surface of the face 16, or of a bead. These various relief irregularities, are produced for example by chemical etching circumscribing the contours of these superficial irregularities; the areas subjected to this etching, are delimited by a masking technique which involves selective exposure of a photosensitive resin. It is also possible to use an inprint pressed by a die, in the manner employed in the manufacture of micro-circuits. The important thing to bear in mind as far as the manufacture of the disc is concerned, is that the exposure of the resin used for the masking function, is effected by a light spot the intensity of which is modulated by a pulse time modulated squarewave electrical signal. The incorporation of the data into the modulating signal is carried out, as required, by frequency of phase-modulation or by any other coding method capable of producing a pulse-coded message.

To conclude the description of the make-up of the record 1, in FIG. 1, it has been assumed that the disc is transparent so that it can be read out by transmission. It has also been assumed that it is rigid although it is equally possible to envisage utilisation of a flexible disc which slides between stabiliser shoes which have not been shown. Self-evidently, the shape of the record 1 is in no way limitative; a record of tape form, containing one or more rectilinear tracks, is conceivable, and in the case of a circular disc, instead of the spiral track a set of concentric circular tracks could be substituted, giving step-by-step access to the recorded data.

In addition to the record 1 and its drive system, FIG. 1 also shows the optical read-out device employed in relation to the track 15. This read-out device is essentially constituted by a light source 5 and an objective lens 7. The source 5, parallel to the axis oz, produces substantially parallel light beams 6 and the microscope objective lens 7 causes the beam 6 to converge at the point 0 on the track 15. The light rays 9 which converge towards the point 0, intersect and diverge beyond said point; after having passed through the disc 1, a fragment of which has been removed in order to simplify the drawing, they illuminate an area 10 which overlaps to a greater or lesser extent the receiving surfaces of two side-by-side photodetector elements 12 and 13. The space separating the receiving surfaces of the photodetector elements 12 and 13, is located plumb in line with the direction oz and orientated along the axis of the track, tangentially to ox at the read-out point 0.

The photodetector elements 12 and 13 furnish electrical signals which are applied respectively to the inputs of a first differential amplifier 17. The output of the amplifier 17 is connected to a low-pass filter 21. This filter 21 supplies an error voltage $\epsilon$ which, through the medium of an electromechanical transducer 8, controls the radial displacement in the o y direction, of the objective lens 7. The electrical signals furnished by the photodetectors 12 and 13 are also applied to resistors 19, which, with the resistor 20 and the operational amplifier 18, constitute an electrical transmission circuit furnishing a signal S(t) proportional to the sum of the signals produced by the two photodetectors 12 and 13.

When the point of convergence 0 of the beam 9 encounters the surface 16 between two diffractive elements 14 succeeding one another on the track 15, no diffraction occurs and the light energy received by the photodetector elements 12 and 13 is confined to the interior of the area 10.

By contrast, as soon as the point of convergency 0 of the beam encounters a diffractive element 14 on the record 1, the light experiences substantial diffraction, this tending to distribute the light energy over a cross-hatched area 11 which substantially exceeds the area 10. The result is a variation in the sum S (t) of the signals furnished by the two photodetector elements 12 and 13. At the time of passage of the elements 14, there is picked up at the output of the amplifier 18 a signal S(t) of squarewave form, which faithfully translates the time variations in the signal engraved in the track 15. As far as the signal S(t) is concerned, it is not mandatory to provide two photodetector elements 12 and 13. The sensitive faces of these two transducers can be combined into one, and an optical mask provided to cover the area 10. Under these conditions, overlapping of the area 10 which is masked, will indicate the passage of a diffractive element 14, in the form of an appreciable variation in the voltage produced by the single photodetector. Instead of providing a mask, it is simpler to separate the photodetector into two parts, as shown in FIG. 1. This doubling-up has the additional advantage of making it possible to detect deviations on the part of the point of convergence 0 in relation to the axis of the track 15.

Figure 2:
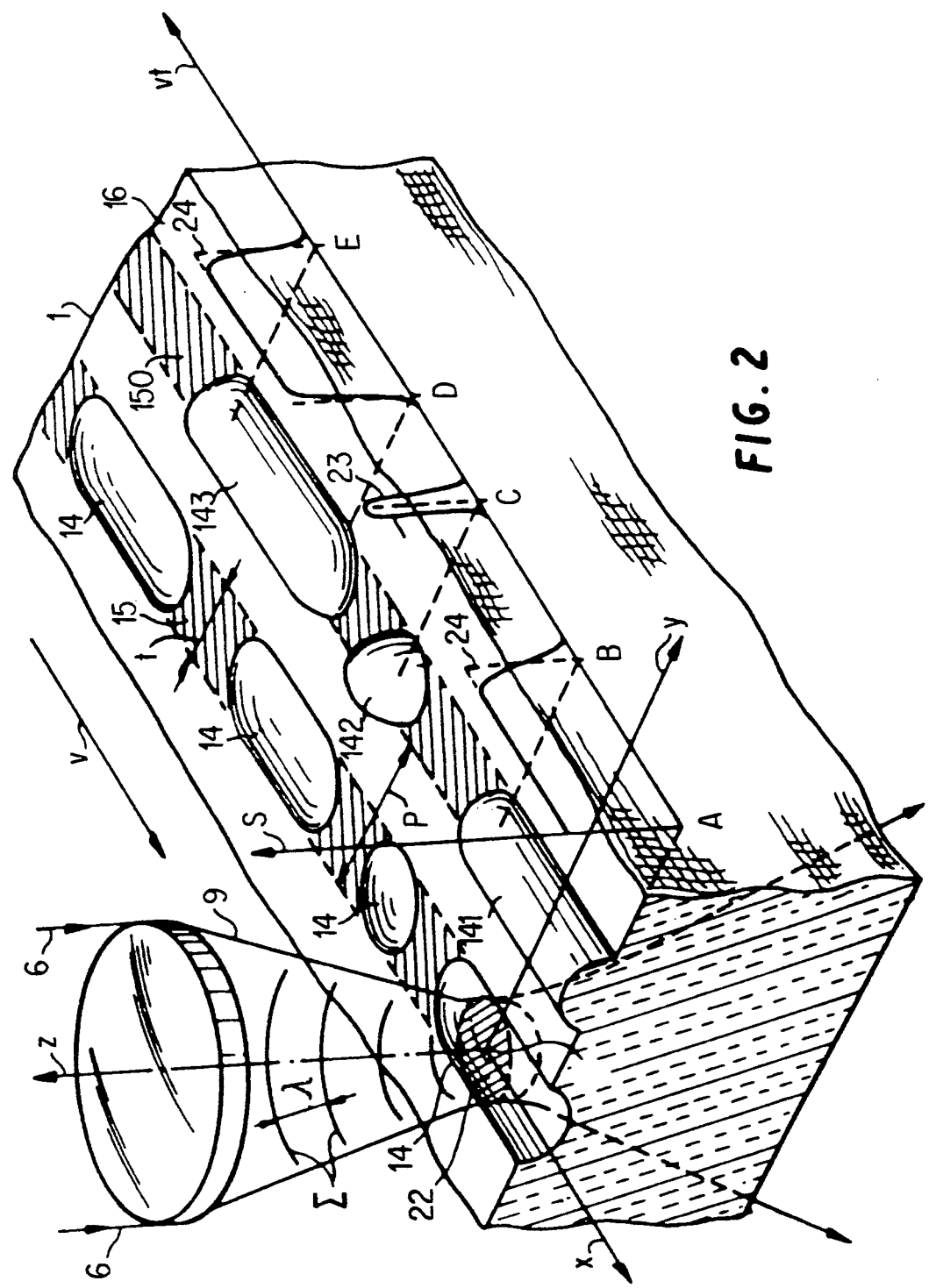
FIG. 2 is a partial isometric view illustrating a fragment of the record shown in FIG. 1, at substantial magnification.

FIG. 2, at a very large magnification, illustrates a tiny fragment of the record 1, located at the position of the read-out device. To illustrate the shape of the depressions and projections which the engraved profile can exhibit, on a turn 15, surface irregularities 14 in the form of more or less elongated troughs have been shown; on the neighbouring turn 150, the irregularities 141, 142 and 143 are constituted by more or less elongated beads. The read-out beam 9 has also been illustrated by showing its contour. The objective lens 7, because of its imperfections and because of the diffraction of the light, forms at the surface 16 of the record 1 a spot 22 which substantially occupies the width 1 of the track 15. This spot has a minimum diameter of the same order of magnitude as the wavelength λ separating two successive wave surfaces Σ of the read-out radiation 9. The envelope of the illuminating beam has its minimum section at the focus 0 of the objective lens 7 and it flares only gently around this position so that the record system is able to make vertical displacements of several microns without any substantial change in the conditions of illumination of the track.

To illustrate the foregoing, in FIG. 2 there has been produced in relation to the projecting elements 141, 142 and 143 of the turn 150, a diagram which represents the time variation of the signal S recorded in this section of the turn. The signal S is a pulse time modulated squarewave signal, the top levels AB, C and DE of which correspond to the scanning of the beads 141, 142 and 143 by the beam 9. During the scanning of the turn 150, the carrier 1 moves at the speed $V = \omega R$, where $\omega$ is the angular velocity of the disc and R the radius of the turn. The bottom levels of the signals S, correspond to the transistions away from the parts of the turn. The pitch p of the turns is chosen so that the light spot 22 can only read one turn at a time. The pitch p will be for example two to three times greater than the width 1 of the turns.

So far as the distribution of the light energy is concerned, from the enlarged view of FIG. 2 it will be seen that the light rays 9 emerging from the objective lens 7 cross one another in a pseudo-conical volume which has its minimum section 22 at the level of the focus 0. In the absence of diffraction at the surface 16, the light energy is confined to this volume. By contrast, if the beam 9 is intercepted by a diffracting element 14, dispersion of the light energy within the solid angle having its apex at the point 0 takes place. A photodetector located in the volume delimited by the dotted lines flaring beneath the light spot 22 will experience a variation in the luminous intensity received in the presence of diffraction. The same photodetector could equally well be arranged outside this volume. In addition, if the light volume forming at the exit from the lens 7 is split into two parts and if these parts are located to the left and to the right of the plane xoz containing the axis of the track and the axis of the beam, then symmetrical distribution of the light energy will be obtained when the light spot 22 is centered on a diffractive element 14 and the track 15.

If the light spot 22 is eccentric by the quantity $\Delta y$ in relation to the axis of the track 15, the light energy fractions will be distributed asymmetrically to either side of the plane xoz; it is thus possible to detect the offset $\Delta y$ by utilising two photodetector elements.

Figure 3:
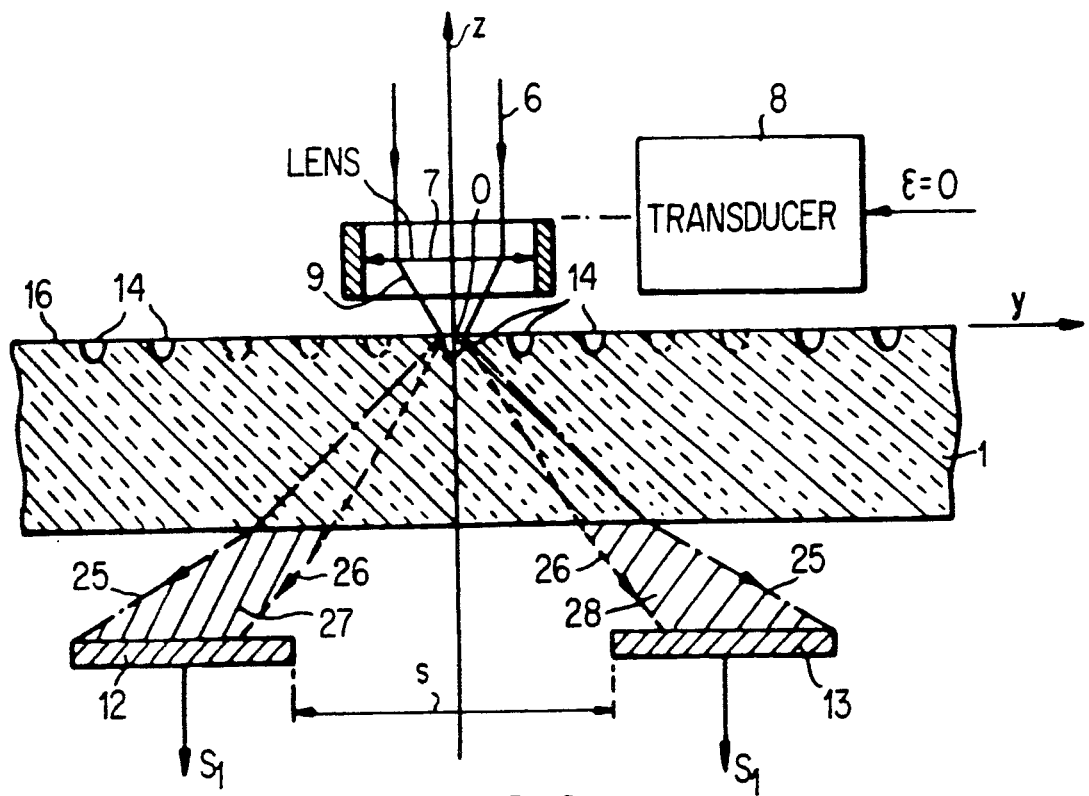
FIG. 3 is a sectional view illustrating the essential elements of a read-out device centred in relation to the track being read out.

The sectional view of FIG. 3 corresponds to the plane of the section yoz of FIG. 1, and illustrates the path taken by the light rays when the light beam 9 concentrated by the objective lens 7 is centred on a diffractive element 14. In the absence of any diffraction, the light energy is confined between the rays 26 illustrated in dotted line, and a small portion of this light energy reaches the receiving surfaces of the photodetector elements 12 and 13 which are separated by the distance S. In this case, equal currents $S_1$ and $S_2$ are delivered by the photodetector elements 12 and 13 and if we consider the circuits of FIG. 1, it will be seen that the amplifier 17 produces a zero voltage, this being translated into terms of an error signal $\epsilon$ which produces no displacement of the objective lens 7 under the influence of the electromechanical transducer 8.

When a diffractive element enters the path of the light the marginal rays 25 appear and define, with the rays 26, the illumination zones 27 and 28 which cause the currents $S_1$ and $S_2$ to vary by the same quantity. The sum of these variations is available at the output of the amplifier 18, in the form of a signal S (t) which represents the scanning of the element 14 by a change in level. By contrast, because of the quality of these variations, the voltage produced by the differential amplifier 17 remains unmodified.

Figure 4:
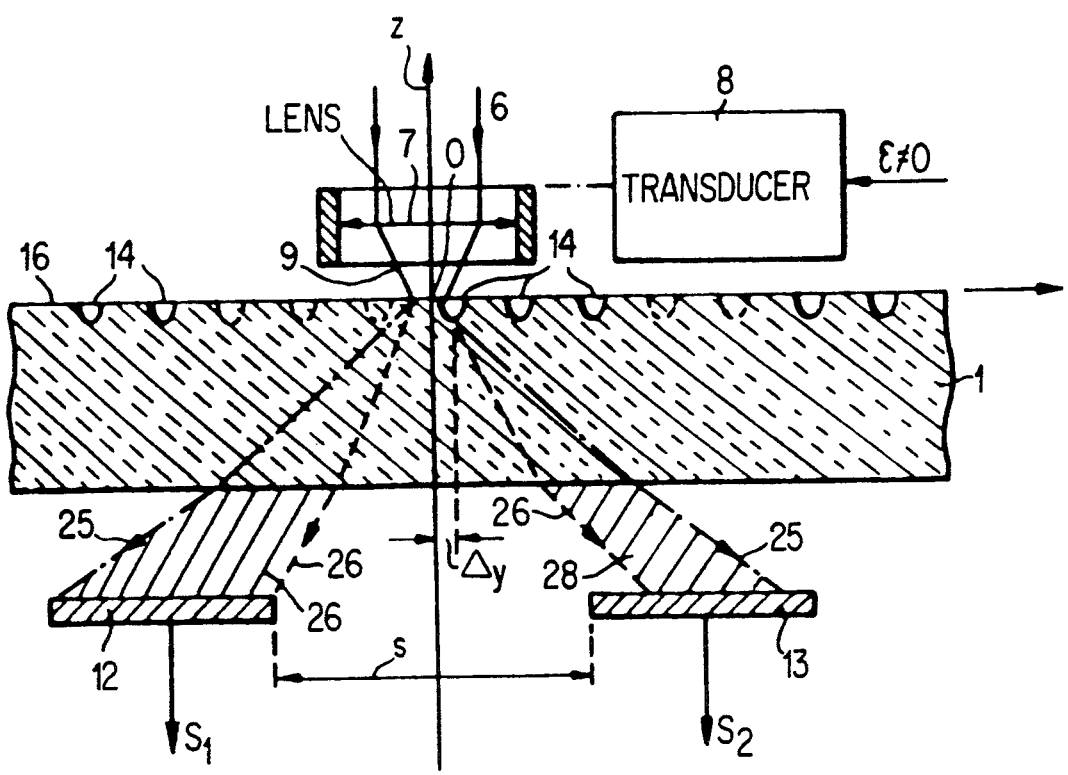
FIG. 4 is a sectional view illustrating the device shown in FIG. 3 in an eccentric position.

In FIG. 4, the path of the light rays has been illustrated in the case of an offset $\Delta y$ on the part of the axis of the objective lens 7, in relation to the track element 14 being read out. It will be seen that the zone 27 contains a different energy fraction to the zone 28, because of the offset; the result is variations in the currents $S_1$ and $S_2$ and in the error voltage $\epsilon$ produced by the filter 20, this voltage acquiring a value which, under the action of the transducer, tends to return the objective lens 7 to the centre of the track being read. The positional control or feed-back thus achieved through the agency of the transducer 8, makes it possible to maintain the read-out beam in a perfectly centred relationship in the case of radial fluctuations of the track being read, of as much as several tens of microns; the low-pass filter serves to eliminate the high-frequency components which could disturb the operation of the control.

The control of the objective lens 7 makes it possible to correctly follow a small-pitch spiral trace, despite eccentricity errors in the disc. In the event that it looses the track, the system tends to lock onto an adjacent track, but this could take place without being detected in the case of recording a television video signal, because it is possible to arrange for each revolution of the track to contain the video signal of a television frame. In this case, the track jump will be unobserved because the synchronism of operation is undisturbed.

Figure 5:
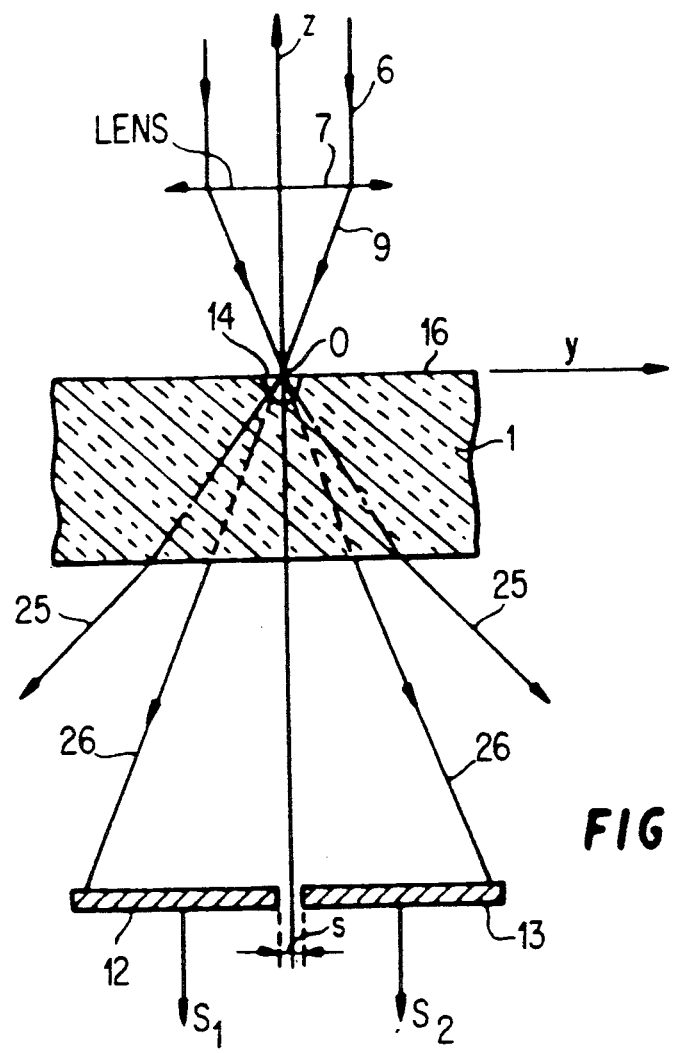
FIG. 5 is a sectional view of a first variant embodiment of the read-out device shown in FIG. 3.

FIG. 5 illustrates a practical example of the system in accordance with the invention. This example is in no way limitative of the scope of the invention and relates to the case of a transparent disc engraved on one face. The beam 6 is produced by a helium-neon laser operating at a power of 1 milliwatt. The wavelength of emission is equal to 0.6328 microns making it possible to choose a diffractive track having a width 1 equal to 1 micron. The diffractive elements 14 take the form of more or less elongated troughs with a depth of 0.5 microns. The two photodetector elements 12 and 13 are silicon cells whose sensitive surfaces have areas of 2 mm$^2$ and are separated from one another by a distance s equal to 0.8 mm. The sensitive surfaces are located at around 6 mm from the surface 16 of the disc 1 and are fully illuminated by the light beam coming from a microscope objective lens 7 having a magnification of 80. The electromechanical transducer 8 which is used to radially displace the objective lens 7, is constituted by a ceramic electrostrictive bimorph device; it is excited by a low-pass filter 21 whose cut-off frequency is some few hundreds of cycles per second.

In the variant embodiment described hereinbefore, the read-out of the record is effected by transmission so that only one face of the disc can be engraved. In order to double the storage capacity of a disc, it can be engraved on both faces provided that the track is read out by reflection.

Figure 6:
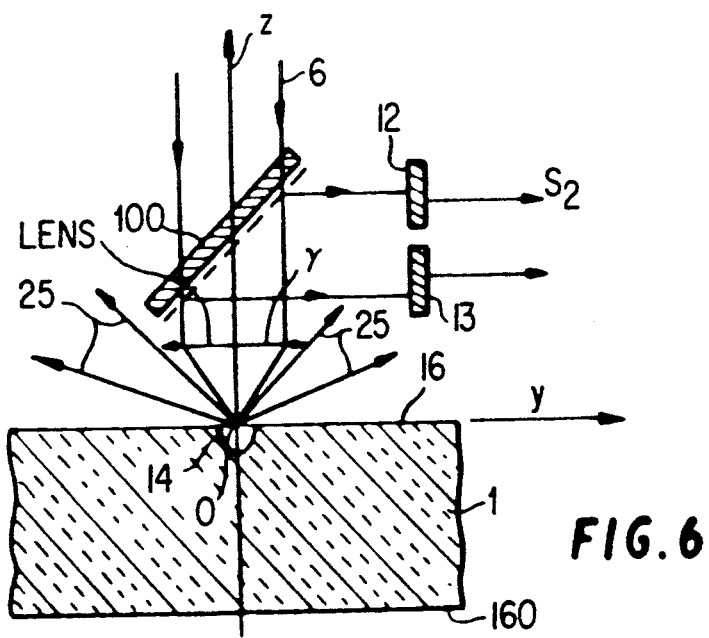
FIG. 6 is a sectional view of a second variant embodiment of the read-out device shown in FIG. 3.

In FIG. 6, a record 1 has been illustrated the faces 16 and 160 of which can be engraved in a similar fashion to that illustrated in FIGS. 1 and 2. The record 1 can be made or a non-transparent material and its engraved faces can, if required, be given a thin reflective coating. The read-out head comprises the same elements as the one hereinbefore described, but the beam 6 is hereby transmitted to the objective lens 7 through a semi-reflective plate 100; this serves to reflect the light in a reverse direction which it takes through the objective lens 7, towards the photodetector elements 12 and 13 arranged laterally and above the surface 16. In the absence of any diffractive element 14 in the illuminated zone of the surface 16, a reflected beam similar to that 6 is received by the photodetector elements 12 and 13. By contrast, in the presence of a diffractive element, the reflected light is diffracted in the directions 25 outside the pupil of the objective lens 7; the result is a reduction in the luminous intensity incident upon the photodetector elements 12 and 13. Apart from these modifications, the mode of operation is essentially the same as that of the read-out devices operating by transmission.

Utilization of the system in accordance with the invention makes it possible to record a band of frequencies reaching the order of video-frequency signals, upon a disc-type record to which the technique of reproduction by hot-pressing a thermoplastic material, can be applied. A disc of this kind can be enclosed in a dust-proof cassette and equipped with a radial window to enable it to be optically read out on a record player of light-scanner type, without it being necessary to utilise a coherent light source. Self-evidently, read-out is not limited to the visible spectrum and it is merely necessary to use a read-out radiation which corresponds to the sources and photodetectors employed.

What I claim is:

1. An arrangement for reading an optically readable light reflective carrier on which data is stored in the form of diffractive data elements which are deviations from a reference surface but not holes through the carrier, a plurality of adjacent tracks located on said carrier, at least one of said data elements being positioned on each of said adjacent tracks, comprising:

illumination means for projecting a concentrated light spot onto said carrier and said data elements, said light spot substantially occupying the width of any one of said data elements being read in order to obtain diffraction of light along the entire length of each of said data elements;

an optical arrangement for collecting light reflected from said carrier in such a manner that the light energy received when the projected light spot impinges on the reference surface is greater than the light energy received when the projected light spot impinges on a data element, the optical arrangement being configured and positioned such that a part of the light diffracted by said data elements is not collected by said optical arrangement; and detection means receiving the collected light for providing a data readout signal.

2. A reading arrangement according to claim 1, wherein said detection means comprises first and second photodetector elements.

3. A reading arrangement according to claim 2, wherein said detection means comprises means for summing a signal from said first and second photodetector elements to provide the data readout signal.

4. A reading arrangement according to claim 2, wherein said detection means comprises means for obtaining a difference signal between said first and second photodetector elements to provide a signal for controlling track registration.

5. A reading arrangement according to claim 4, wherein said detection means comprises means for moving at least a portion of said optical arrangement in response to said signal for controlling track registration.

6. A reading arrangement according to claim 1, wherein said optical arrangement includes a semitransparent mirror.

7. Arrangement according to claim 1, wherein said illumination means comprises a lens and wherein said optical arrangement also comprises said lens.

* * * * *